(12) United States Patent
Wu et al.

(10) Patent No.: US 9,825,618 B2
(45) Date of Patent: Nov. 21, 2017

(54) TUNABLE DELAY CIRCUIT AND OPERATING METHOD THEREOF

(71) Applicant: MediaTek Singapore Pte. Ltd., Singapore (SG)

(72) Inventors: Yipin Wu, Singapore (SG); Heng-Meng Liu, Jhubei (TW)

(73) Assignee: MEDIATEK SINGAPORE PTE. LTD., Singapore (SG)

(*) Notice: Subject to any disclaimer, the term of this patent is extended or adjusted under 35 U.S.C. 154(b) by 0 days.

(21) Appl. No.: 14/986,170

(22) Filed: Dec. 31, 2015

(65) Prior Publication Data

US 2016/0211835 A1    Jul. 21, 2016

Related U.S. Application Data

(60) Provisional application No. 62/105,414, filed on Jan. 20, 2015.

(51) Int. Cl.
*H03K 5/13* (2014.01)
*H03K 3/03* (2006.01)
*H03K 5/133* (2014.01)
*H03K 19/20* (2006.01)
*H03K 19/173* (2006.01)

(52) U.S. Cl.
CPC .......... *H03K 5/133* (2013.01); *H03K 3/0315* (2013.01); *H03K 19/1737* (2013.01); *H03K 19/20* (2013.01)

(58) Field of Classification Search
USPC .................................. 327/276–278, 283–285
See application file for complete search history.

(56) References Cited

U.S. PATENT DOCUMENTS

| | | | |
|---|---|---|---|
| 4,458,165 A * | 7/1984 | Jackson ............... | H03K 3/0315 327/276 |
| 6,937,077 B2 * | 8/2005 | Zarate .................. | H03L 7/0814 327/158 |
| 7,095,261 B2 * | 8/2006 | Drexler .................... | G11C 7/22 327/153 |
| 7,230,498 B2 * | 6/2007 | Osvaldella ............. | H03K 5/133 327/158 |
| 7,486,125 B2 * | 2/2009 | Chae ...................... | H03K 5/131 327/272 |
| 8,838,856 B2 * | 9/2014 | Partani ................... | H04L 41/04 710/62 |

\* cited by examiner

*Primary Examiner* — An Luu
(74) *Attorney, Agent, or Firm* — McClure, Qualey & Rodack, LLP

(57) ABSTRACT

A tunable delay circuit includes a first multiplexer, a delay chain, and a second multiplexer. The first multiplexer selects an input signal or a feedback signal as a first output signal according to an enable signal. The delay chain delays the first output signal for different time periods so as to generate a plurality of delay signals. One of the delay signals is used as the feedback signal. The second multiplexer selects one of the delay signals as a second output signal according to a pass signal.

20 Claims, 4 Drawing Sheets

TUNABLE DELAY CIRCUIT AND OPERATING METHOD THEREOF

CROSS REFERENCE TO RELATED APPLICATIONS

This application claims the benefit of U.S. Provisional Application No. 62/105,414, filed on Jan. 20, 2015, the entirety of which is incorporated by reference herein.

BACKGROUND OF THE INVENTION

Field of the Invention

The disclosure generally relates to a delay circuit, and more particularly, to a delay circuit with a tunable and measurable delay time.

Description of the Related Art

Clock tree circuits are commonly used in the field of digital circuit design. However, since the driving paths in clock tree circuits often have different lengths, they tend to result in clock skew, and degrade the performance of the whole system. The different lengths of driving paths may also be caused by on-chip variations (OCV), which are unpredictable and uncontrollable. Accordingly, there is a need to design a novel circuit to solve the above problem.

BRIEF SUMMARY OF THE INVENTION

In one exemplary embodiment, the disclosure is directed to a tunable delay circuit including a first multiplexer, a delay chain, and a second multiplexer. The first multiplexer selects an input signal or a feedback signal as a first output signal according to an enable signal. The delay chain delays the first output signal for different time periods so as to generate a plurality of delay signals. One of the delay signals is used as the feedback signal. The second multiplexer selects one of the delay signals as a second output signal according to a pass signal.

In some embodiments, when the first multiplexer selects the input signal, the tunable delay circuit is operated in a delay mode, and when the first multiplexer selects the feedback signal, the tunable delay circuit is operated in an oscillating mode.

In some embodiments, in the oscillating mode, a ring oscillator is formed by the first multiplexer and the delay chain.

In some embodiments, a total delay time of the tunable delay circuit is measurable by analyzing an oscillating frequency of the ring oscillator.

In some embodiments, in the delay mode, a total delay time of the tunable delay circuit is adjustable by changing the pass signal.

In some embodiments, the first multiplexer includes: a first NAND gate, wherein the first NAND gate has a first input terminal for receiving the input signal, a second input terminal for receiving an inverted enable signal, and an output terminal; a second NAND gate, wherein the second NAND gate has a first input terminal for receiving the feedback signal, a second input terminal for receiving the enable signal, and an output terminal; and an AND gate, wherein the AND gate has a first input terminal coupled to the output terminal of the first NAND gate, a second input terminal coupled to the output terminal of the second NAND gate, and an output terminal for outputting the first output signal.

In some embodiments, the pass signal includes a plurality of pass bits, and the delay chain and the second multiplexer include: a third NAND gate, wherein the third NAND gate has a first input terminal for receiving the first output signal, a second input terminal for receiving a first pass bit, and an output terminal; a fourth NAND gate, wherein the fourth NAND gate has a first input terminal for receiving an inverted first pass bit, a second input terminal for receiving the first output signal, and an output terminal; a fifth NAND gate, wherein the fifth NAND gate has a first input terminal coupled to the output terminal of the third NAND gate, a second input terminal, and an output terminal for outputting the feedback signal; and a sixth NAND gate, wherein the sixth NAND gate has a first input terminal coupled to the second input terminal of the fifth NAND gate, a second input terminal coupled to the output terminal of the third NAND gate, and an output terminal for outputting the second output signal.

In some embodiments, the delay chain and the second multiplexer further include: a seventh NAND gate, wherein the seventh NAND gate has a first input terminal coupled to the output terminal of the fourth NAND gate, a second input terminal for receiving a second pass bit, and an output terminal; an eighth NAND gate, wherein the eighth NAND gate has a first input terminal for receiving an inverted second pass bit, a second input terminal coupled to the output terminal of the fourth NAND gate, and an output terminal; a ninth NAND gate, wherein the ninth NAND gate has a first input terminal coupled to the output terminal of the seventh NAND gate, a second input terminal, and an output terminal coupled to the first input terminal of the sixth NAND gate; and a tenth NAND gate, wherein the tenth NAND gate has a first input terminal coupled to the second input terminal of the ninth NAND gate, a second input terminal coupled to the output terminal of the seventh NAND gate, and an output terminal.

In some embodiments, the delay chain and the second multiplexer further include: an eleventh NAND gate, wherein the eleventh NAND gate has a first input terminal coupled to the output terminal of the eighth NAND gate, a second input terminal for receiving a third pass bit, and an output terminal; a twelfth NAND gate, wherein the twelfth NAND gate has a first input terminal for receiving an inverted third pass bit, a second input terminal coupled to the output terminal of the eighth NAND gate, and an output terminal; a thirteenth NAND gate, wherein the thirteenth NAND gate has a first input terminal coupled to the output terminal of the eleventh NAND gate, a second input terminal, and an output terminal coupled to the first input terminal of the tenth NAND gate; and a fourteenth NAND gate, wherein the fourteenth NAND gate has a first input terminal coupled to the second input terminal of the thirteenth NAND gate and to the output terminal of the twelfth NAND gate, a second input terminal coupled to the output terminal of the eleventh NAND gate, and an output terminal.

In some embodiments, the output terminal of the tenth NAND gate and the output terminal of the fourteenth NAND gate are kept floating.

In some embodiments, when the first pass bit has a high logic level and the second pass bit has a high logic level and the third pass bit has a high logic level, a total delay time of the tunable delay circuit is relatively short; when the first pass bit has a low logic level and the second pass bit has a high logic level and the third pass bit has a high logic level, the total delay time of the tunable delay circuit is relatively medium; and when the first pass bit has a low logic level and the second pass bit has a low logic level and the third pass bit has a high logic level, the total delay time of the tunable delay circuit is relatively long.

In another exemplary embodiment, the disclosure is directed to a method for operating a tunable delay circuit, including the steps of: selecting an input signal or a feedback signal as a first output signal according to an enable signal by a first multiplexer; delaying the first output signal for different time periods so as to generate a plurality of delay signals by a delay chain, wherein one of the delay signals is used as the feedback signal; and selecting one of the delay signals as a second output signal according to a pass signal by a second multiplexer.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Figure 1:
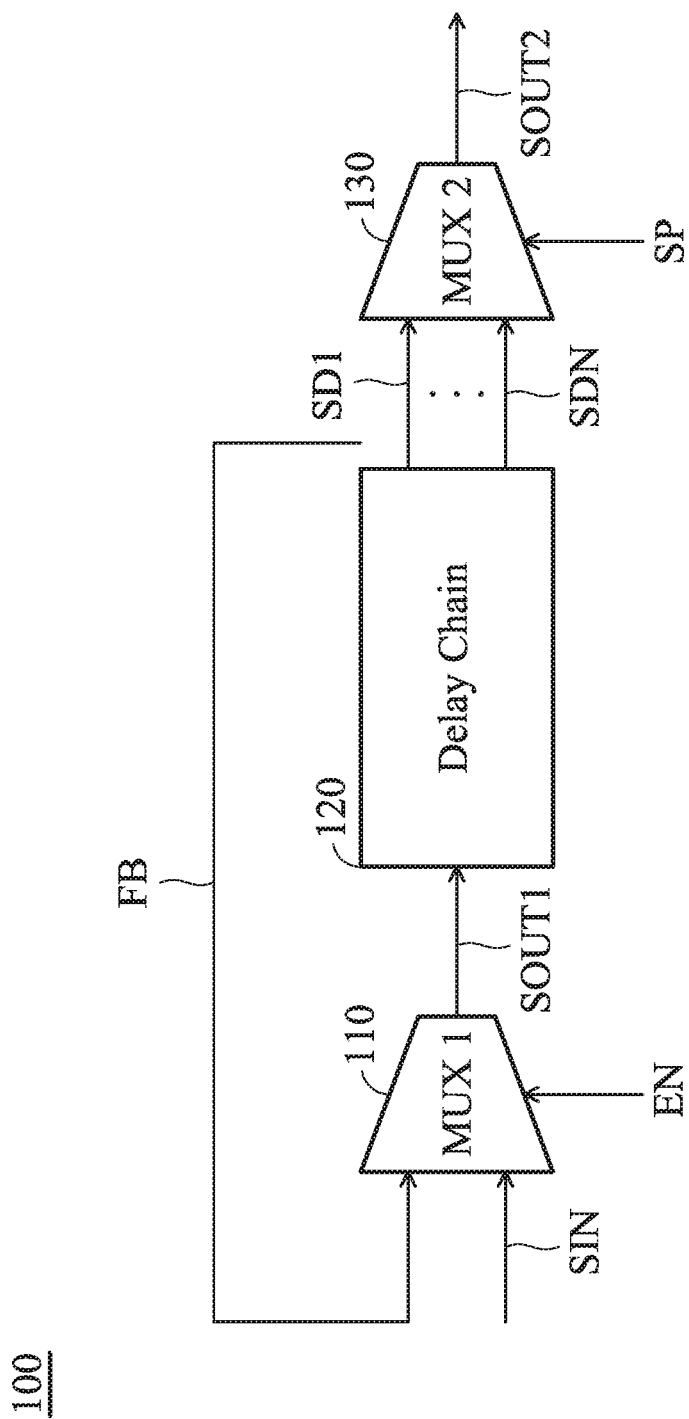
FIG. 1 is a diagram of a tunable delay circuit according to an embodiment of the invention.

FIG. 1 is a diagram of a tunable delay circuit 100 according to an embodiment of the invention. The tunable delay circuit 100 may be applied to integrated circuits and configured to compensate for the clock skew, which may be caused by on-chip variations (OCV) and/or different lengths of clock driving paths. As shown in FIG. 1, the tunable delay circuit 100 includes a first multiplexer (MUX 1) 110, a delay chain 120, and a second multiplexer (MUX 2) 130. The first multiplexer 110 is configured to select an input signal SIN or a feedback signal FB as a first output signal SOUT1 according to an enable signal EN. The first output signal SOUT1 is forwarded to the delay chain 120. The delay chain 120 may include multiple cascading delay units (not shown). The delay chain 120 is configured to delay the first output signal SOUT1 for different time periods so as to generate multiple delay signals SD1, . . . , and SDN (N may be any integer which is equal to or greater than 2). Any one of the delay signals SD1, . . . , and SDN may be used as the feedback signal FB, which is fed back to the first multiplexer 110. The feedback signal FB may be a fixed one of the delay signals SD1, . . . , and SDN, or alternatively, may be changeable and selected among the delay signals SD1, . . . , and SDN. The delay signals SD1, . . . , and SDN are all forwarded to the second multiplexer 130. The second multiplexer 130 is configured to select one of the delay signals SD1, . . . , and SDN as a second output signal SOUT2 according to a pass signal SP. Generally speaking, the tunable delay circuit 100 is configured to delay the input signal SIN for a specific time period so as to generate the second output signal SOUT2. The second output signal SOUT2 is considered as a final output of the tunable delay circuit 100. The specific time period is tunable and measurable, and therefore such a design can overcome the clock skew in the whole system. The detailed structure and operation of the tunable delay circuit 100 will be introduced in the following embodiments.

The tunable delay circuit 100 can be operated in either a delay mode or an oscillating mode. The delay mode is a normal work mode of the tunable delay circuit 100, and the oscillating mode is a calibrating and measuring mode of the tunable delay circuit 100. When the first multiplexer 110 selects the input signal SIN as the first output signal SOUT1, the tunable delay circuit 100 is operated in the delay mode. When the first multiplexer 110 selects the feedback signal FB as the first output signal SOUT1, the tunable delay circuit 100 is operated in the oscillating mode.

In the delay mode, the total delay time of the tunable delay circuit 100 is adjustable by changing the pass signal SP. For example, the delay signals SD1, . . . , and SDN may have different delay time periods. If the pass signal SP is changed, the second output signal SOUT2, selected by the second multiplexer 130, may be changed from one to another of the delay signals SD1, . . . , and SDN, such that the total delay time of the tunable delay circuit 100 may be adjusted. In the oscillating mode, a ring oscillator is formed by the first multiplexer 110 and the delay chain 120. That is, the feedback signal FB is selected as the first output signal SOUT1 by the first multiplexer 110, delayed by the delay chain 120, and then fed back to the first multiplexer 110, such that a closed oscillating path is formed. The total delay time of the tunable delay circuit 100 is measurable by analyzing the oscillating frequency of the ring oscillator. For example, the second output signal SOUT2 may include the information of the oscillating frequency. The oscillating frequency may be analyzed, and therefore a total delay time corresponding to the oscillating frequency may be obtained. In some embodiments, a table is stored in a storage device (not shown) and used to record the relationship between the oscillating frequency and the total delay time of the tunable delay circuit 100, such that the total delay time may be measured by monitoring the oscillating frequency and looking it up in the table.

Figure 2:
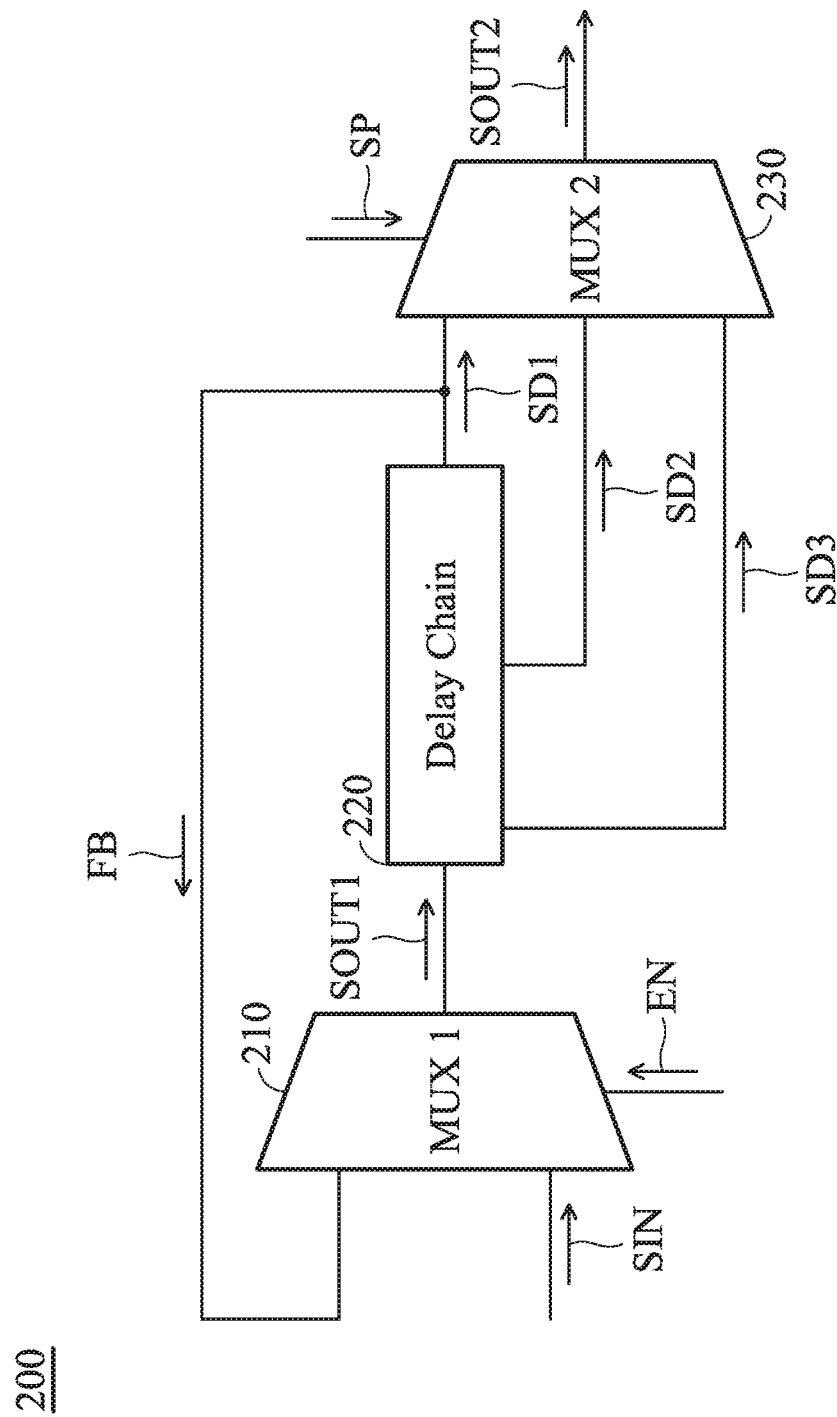
FIG. 2 is a diagram of a tunable delay circuit according to an embodiment of the invention.

FIG. 2 is a diagram of a tunable delay circuit 200 according to an embodiment of the invention. The tunable delay circuit 200 includes a first multiplexer 210, a delay chain 220, and a second multiplexer 230. The embodiment of FIG. 2 is a special case of the embodiment of FIG. 1, in which the aforementioned integer N is set to 3. In the embodiment of FIG. 2, the delay chain 220 outputs three delay signals SD1, SD2, and SD3 with different delay time periods (from the longest to the shortest), and the delay signal SD1 is used as a feedback signal FB, which is fed back to the first multiplexer 210. However, the invention is not limited to the above. In alternative embodiments, the delay chain 220 may output more or fewer delay signals, and a different delay signal (e.g., the delay signal SD2 or SD3) may be used as the feedback signal FB. Other features of the tunable delay circuit 200 of FIG. 2 are similar to those of the tunable delay circuit 100 of FIG. 1. Accordingly, the two embodiments can achieve similar levels of performance.

Figure 3:
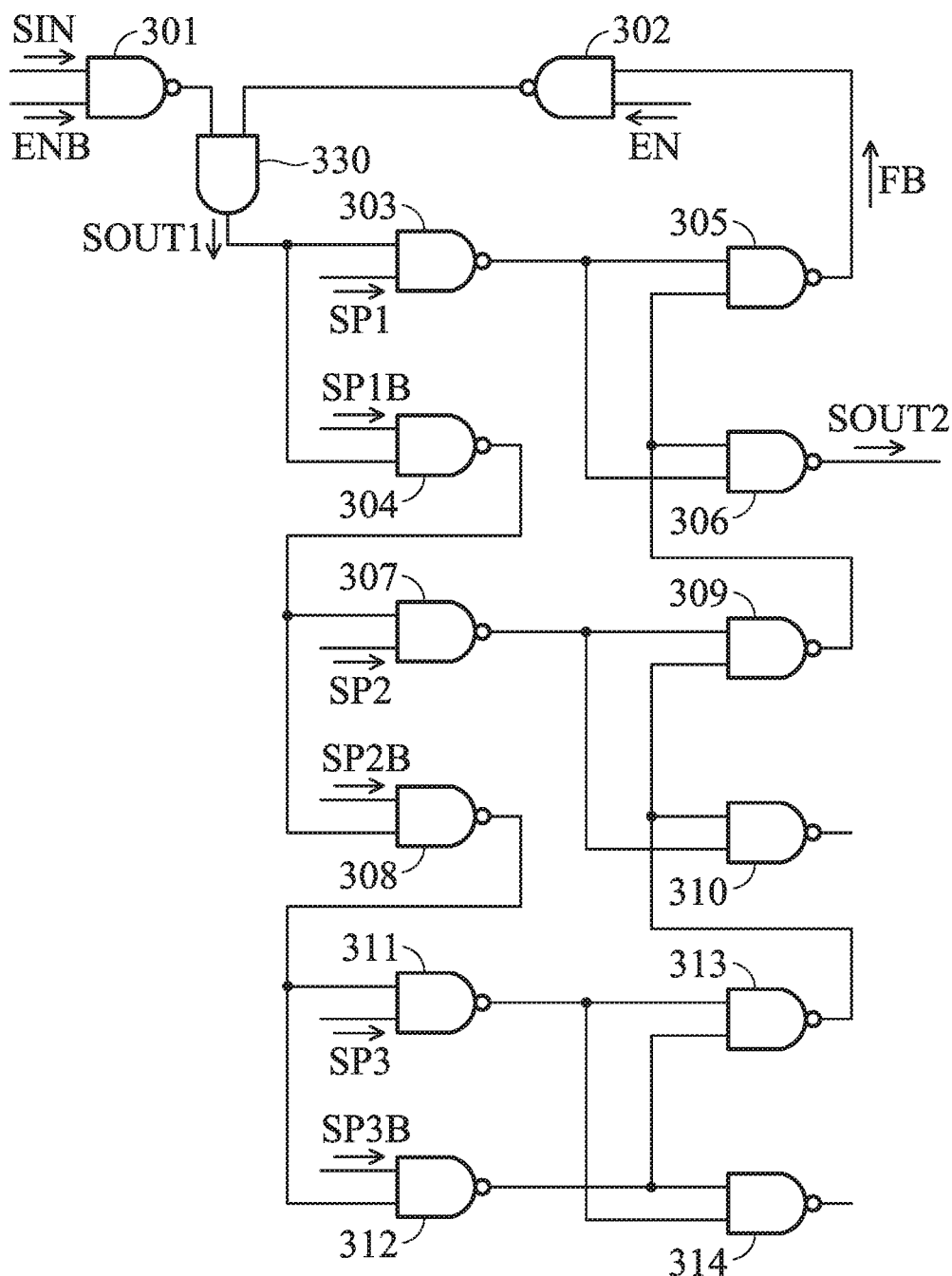
FIG. 3 is a diagram of a tunable delay circuit according to an embodiment of the invention.

FIG. 3 is a diagram of a tunable delay circuit 300 according to an embodiment of the invention. The embodiment of FIG. 3 describes the detailed structure of the tunable delay circuit 200 of FIG. 2. The functions and features of the tunable delay circuit 300 are similar to those of FIG. 1 and FIG. 2. In the embodiment of FIG. 3, the aforementioned pass signal SP includes multiple pass bits SP1, SP2, and SP3. Complementary signals are also included, and they may be generated through inverters (not shown). For example, an inverted enable signal ENB may have a reverse logic level of an enable signal EN; an inverted first pass bit SP1B may have a reverse logic level of a first pass bit SP1; an inverted second pass bit SP2B may have a reverse logic level of a second pass bit SP2; and an inverted third pass bit SP3B may have a reverse logic level of a third pass bit SP3.

A first multiplexer of the tunable delay circuit 300 includes a first NAND gate 301, a second NAND gate 302, and an AND gate 330. The first NAND gate 301 has a first input terminal for receiving an input signal SIN, a second input terminal for receiving the inverted enable signal ENB, and an output terminal. The second NAND gate 302 has a first input terminal for receiving a feedback signal FB, a second input terminal for receiving the enable signal EN, and an output terminal. The AND gate 330 has a first input terminal coupled to the output terminal of the first NAND gate 301, a second input terminal coupled to the output terminal of the second NAND gate 302, and an output terminal for outputting a first output signal SOUT1.

A combination of a delay chain and a second multiplexer of the tunable delay circuit 300 includes a third NAND gate 303, a fourth NAND gate 304, a fifth NAND gate 305, a sixth NAND gate 306, a seventh NAND gate 307, an eighth NAND gate 308, a ninth NAND gate 309, a tenth NAND gate 310, an eleventh NAND gate 311, a twelfth NAND gate 312, a thirteenth NAND gate 313, and a fourteenth NAND gate 314.

The third NAND gate 303 has a first input terminal for receiving the first output signal SOUT1, a second input terminal for receiving the first pass bit SP1, and an output terminal. The fourth NAND gate 304 has a first input terminal for receiving the inverted first pass bit SP1B, a second input terminal for receiving the first output signal SOUT1, and an output terminal. The fifth NAND gate 305 has a first input terminal coupled to the output terminal of the third NAND gate 303, a second input terminal, and an output terminal for outputting the feedback signal FB. The sixth NAND gate 306 has a first input terminal coupled to the second input terminal of the fifth NAND gate 305, a second input terminal coupled to the output terminal of the third NAND gate 303, and an output terminal for outputting a second output signal SOUT2. The seventh NAND gate 307 has a first input terminal coupled to the output terminal of the fourth NAND gate 304, a second input terminal for receiving the second pass bit SP2, and an output terminal. The eighth NAND gate 308 has a first input terminal for receiving the inverted second pass bit SP2B, a second input terminal coupled to the output terminal of the fourth NAND gate 304, and an output terminal. The ninth NAND gate 309 has a first input terminal coupled to the output terminal of the seventh NAND gate 307, a second input terminal, and an output terminal coupled to the first input terminal of the sixth NAND gate 306. The tenth NAND gate 310 has a first input terminal coupled to the second input terminal of the ninth NAND gate 309, a second input terminal coupled to the output terminal of the seventh NAND gate 307, and an output terminal. The eleventh NAND gate 311 has a first input terminal coupled to the output terminal of the eighth NAND gate 308, a second input terminal for receiving the third pass bit SP3, and an output terminal. The twelfth NAND gate 312 has a first input terminal for receiving the inverted third pass bit SP3B, a second input terminal coupled to the output terminal of the eighth NAND gate 308, and an output terminal. The thirteenth NAND gate 313 has a first input terminal coupled to the output terminal of the eleventh NAND gate 311, a second input terminal, and an output terminal coupled to the first input terminal of the tenth NAND gate 310. The fourteenth NAND gate 314 has a first input terminal coupled to the second input terminal of the thirteenth NAND gate 313 and to the output terminal of the twelfth NAND gate 312, a second input terminal coupled to the output terminal of the eleventh NAND gate 311, and an output terminal. The output terminal of the tenth NAND gate 310 and the output terminal of the fourteenth NAND gate 314 may be kept in floating states (high impedance).

In a delay mode, the enable signal EN has a low logic level (i.e., logic "0") so as to receive the input signal SIN and block the feedback signal FB, and the tunable delay circuit 300 can provide a short, medium, or long delay time according to the pass signal. When the first pass bit SP1 has a high logic level and the second pass bit SP2 has a high logic level and the third pass bit SP3 has a high logic level (i.e., the pass signal has a binary logic "111"), the total delay time of the tunable delay circuit 300 is relatively short, and the second output signal SOUT2 is generated by delaying the first output signal SOUT1 for two NAND-gate delay time periods (303 to 306). When the first pass bit SP1 has a low logic level and the second pass bit SP2 has a high logic level and the third pass bit SP3 has a high logic level (i.e., the pass signal has a binary logic "011"), the total delay time of the tunable delay circuit 300 is relatively medium, and the second output signal SOUT2 is generated by delaying the first output signal SOUT1 for four NAND-gate delay time periods (304 to 307 to 309 to 306). When the first pass bit SP1 has a low logic level and the second pass bit SP2 has a low logic level and the third pass bit SP3 has a high logic level (i.e., the pass signal has a binary logic "001"), the total delay time of the tunable delay circuit 300 is relatively long, and the second output signal SOUT2 is generated by delaying the first output signal SOUT1 for six NAND-gate delay time periods (304 to 308 to 311 to 313 to 309 to 306). In some embodiments, the NAND gates not in use are turned off so as to reduce the power consumption of the whole system. For example, when the pass signal has a binary logic "011", the delay path is from the fourth NAND gate 304 through the seventh NAND gate 307 and the ninth NAND gate 309 to the sixth NAND gate 306. At this time, the eighth NAND gate 308, the tenth NAND gate 310, and the eleventh NAND gate 311 to the fourteenth NAND gate 314 may be all turned off because they are not in use, and the total power consumption of the tunable delay circuit 300 is reduced accordingly.

In an oscillating mode, the enable signal EN has a high logic level so as to receive the feedback signal FB and block the input signal SIN, and the tunable delay circuit 300 forms a ring oscillator with a short, medium, or long oscillating path according to the pass signal. When the first pass bit SP1 has a high logic level and the second pass bit SP2 has a high logic level and the third pass bit SP3 has a high logic level (i.e., the pass signal has a binary logic "111"), the oscillating path of the ring oscillator is relatively short (302 to 330 to 303 to 305 to 302). When the first pass bit SP1 has a low logic level and the second pass bit SP2 has a high logic level and the third pass bit SP3 has a high logic level (i.e., the pass signal has a binary logic "011"), the oscillating path of the ring oscillator is relatively medium (302 to 330 to 304 to 307 to 309 to 305 to 302). When the first pass bit SP1 has a low logic level and the second pass bit SP2 has a low logic level and the third pass bit SP3 has a high logic level (i.e., the pass signal has a binary logic "001"), the oscillating path of the ring oscillator is relatively long (302 to 330 to 304 to 308 to 311 to 313 to 309 to 305 to 302). In some embodiments, the NAND gates not in use are turned off so as to reduce the power consumption of the whole system. For example, when the pass signal has a binary logic "011", the oscillating path is from the second NAND gate 302 through the AND gate 330, the fourth NAND gate 304, the seventh NAND gate 307, the ninth NAND gate 309, the fifth NAND gate 305 then back to the second NAND gate 302. At this time, the eighth NAND gate 308, the tenth NAND gate 310, and the eleventh NAND gate 311 to the fourteenth NAND gate 314 may be all turned off because they are not in use, and the total power consumption of the tunable delay circuit 300 is reduced accordingly. The precise delay time period of each oscillating path may be measured by analyzing the oscillating frequency of the ring oscillator. For example, the oscillating frequency may be extracted from the second output signal SOUT2, and a specific delay time period corresponding to the oscillating frequency can be calculated by a processor (not shown).

Figure 4:
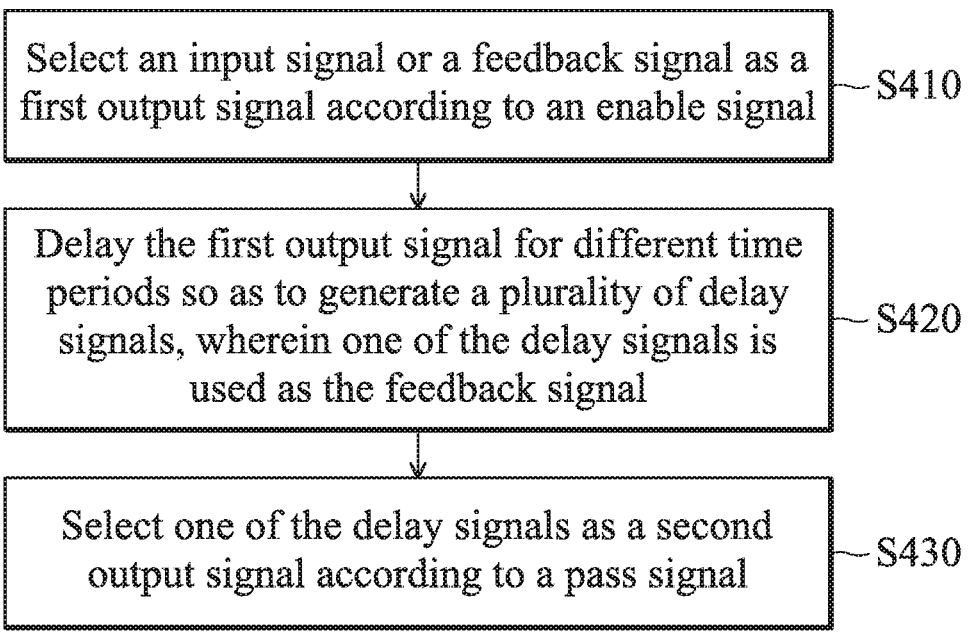
FIG. 4 is a flowchart of a method for operating a tunable delay circuit according to an embodiment of the invention.

FIG. 4 is a flowchart of a method for operating a tunable delay circuit according to an embodiment of the invention. To begin, in step S410, an input signal or a feedback signal is selected as a first output signal by a first multiplexer of the tunable delay circuit according to an enable signal. Next, in step S420, the first output signal is delayed for different time periods by a delay chain of the tunable delay circuit so as to generate a plurality of delay signals, and one of the delay signals is used as the feedback signal. Finally, in step S430, one of the delay signals is selected as a second output signal by a second multiplexer of the tunable delay circuit according to a pass signal. It should be understood that the above steps are not required to be performed in order, and every detailed feature of the embodiments of FIG. 1, FIG. 2, and FIG. 3 may be applied to the method of the embodiment of FIG. 4.

The invention provides a tunable delay circuit, which is configured to solve the problem of clock skew due to different lengths of clock driving paths and/or on-chip variations (OCV). The tunable delay circuit may be incorporated into each clock driving path. If the length of the clock driving path is relatively short, the total delay time of the tunable delay circuit may be increased, and conversely, if the length of the clock driving path is relatively long, the total delay time of the tunable delay circuit may be decreased, so as to compensate for the unsynchronized clock effect. Since on-chip variations always exist in integrated circuits, there is a need to calibrate and measure the total delay time of the tunable delay circuit precisely. The tunable delay circuit of the invention can provide mechanisms for calibration and measurement by forming a ring oscillator and analyzing its oscillating frequency, so that a precise total delay time can be obtained.

The above embodiments are just exemplary, rather than limitations of the invention. It should be understood that the tunable delay circuit and the operating method thereof are not limited to the configurations and flowcharts of FIG. 1 to FIG. 4. The invention may merely include any one or more features of any one or more embodiments of FIG. 1 to FIG. 4. In other words, not all of the features shown in the figures should be implemented in the tunable delay circuit and the operating method of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A tunable delay circuit, comprising:
a first multiplexer, selecting an input signal or a feedback signal as a first output signal according to an enable signal;
a delay chain, delaying the first output signal for different time periods so as to generate a plurality of delay signals, wherein one of the delay signals is used as the feedback signal; and
a second multiplexer, selecting one of the delay signals as a second output signal according to a pass signal;
wherein the first multiplexer comprises a first NAND gate having a first input terminal for receiving the input signal, and a second input terminal for receiving an inverted enable signal;
wherein the first multiplexer further comprises:
a second NAND gate, wherein the second NAND gate has a first input terminal for receiving the feedback signal, a second input terminal for receiving the enable signal, and an output terminal; and
an AND gate, wherein the AND gate has a first input terminal coupled to an output terminal of the first NAND gate, a second input terminal coupled to the output terminal of the second NAND gate, and an output terminal for outputting the first output signal.

2. The tunable delay circuit as claimed in claim 1, wherein when the first multiplexer selects the input signal, the tunable delay circuit is operated in a delay mode, and wherein when the first multiplexer selects the feedback signal, the tunable delay circuit is operated in an oscillating mode.

3. The tunable delay circuit as claimed in claim 2, wherein in the oscillating mode, a ring oscillator is formed by the first multiplexer and the delay chain.

4. The tunable delay circuit as claimed in claim 3, wherein a total delay time of the tunable delay circuit is measurable by analyzing an oscillating frequency of the ring oscillator.

5. The tunable delay circuit as claimed in claim 2, wherein in the delay mode, a total delay time of the tunable delay circuit is adjustable by changing the pass signal.

6. The tunable delay circuit as claimed in claim 1, wherein the pass signal comprises a plurality of pass bits, and wherein the delay chain and the second multiplexer comprise:
a third NAND gate, wherein the third NAND gate has a first input terminal for receiving the first output signal, a second input terminal for receiving a first pass bit, and an output terminal;
a fourth NAND gate, wherein the fourth NAND gate has a first input terminal for receiving an inverted first pass bit, a second input terminal for receiving the first output signal, and an output terminal;
a fifth NAND gate, wherein the fifth NAND gate has a first input terminal coupled to the output terminal of the third NAND gate, a second input terminal, and an output terminal for outputting the feedback signal; and
a sixth NAND gate, wherein the sixth NAND gate has a first input terminal coupled to the second input terminal of the fifth NAND gate, a second input terminal coupled to the output terminal of the third NAND gate, and an output terminal for outputting the second output signal.

7. The tunable delay circuit as claimed in claim 6, wherein the delay chain and the second multiplexer further comprise:
- a seventh NAND gate, wherein the seventh NAND gate has a first input terminal coupled to the output terminal of the fourth NAND gate, a second input terminal for receiving a second pass bit, and an output terminal;
- an eighth NAND gate, wherein the eighth NAND gate has a first input terminal for receiving an inverted second pass bit, a second input terminal coupled to the output terminal of the fourth NAND gate, and an output terminal;
- a ninth NAND gate, wherein the ninth NAND gate has a first input terminal coupled to the output terminal of the seventh NAND gate, a second input terminal, and an output terminal coupled to the first input terminal of the sixth NAND gate; and
- a tenth NAND gate, wherein the tenth NAND gate has a first input terminal coupled to the second input terminal of the ninth NAND gate, a second input terminal coupled to the output terminal of the seventh NAND gate, and an output terminal.

8. The tunable delay circuit as claimed in claim 7, wherein the delay chain and the second multiplexer further comprise:
- an eleventh NAND gate, wherein the eleventh NAND gate has a first input terminal coupled to the output terminal of the eighth NAND gate, a second input terminal for receiving a third pass bit, and an output terminal;
- a twelfth NAND gate, wherein the twelfth NAND gate has a first input terminal for receiving an inverted third pass bit, a second input terminal coupled to the output terminal of the eighth NAND gate, and an output terminal;
- a thirteenth NAND gate, wherein the thirteenth NAND gate has a first input terminal coupled to the output terminal of the eleventh NAND gate, a second input terminal, and an output terminal coupled to the first input terminal of the tenth NAND gate; and
- a fourteenth NAND gate, wherein the fourteenth NAND gate has a first input terminal coupled to the second input terminal of the thirteenth NAND gate and to the output terminal of the twelfth NAND gate, a second input terminal coupled to the output terminal of the eleventh NAND gate, and an output terminal.

9. The tunable delay circuit as claimed in claim 8, wherein the output terminal of the tenth NAND gate and the output terminal of the fourteenth NAND gate are kept floating.

10. The tunable delay circuit as claimed in claim 8, wherein when the first pass bit has a high logic level and the second pass bit has a high logic level and the third pass bit has a high logic level, a total delay time of the tunable delay circuit is relatively short, wherein when the first pass bit has a low logic level and the second pass bit has a high logic level and the third pass bit has a high logic level, the total delay time of the tunable delay circuit is relatively medium, and wherein when the first pass bit has a low logic level and the second pass bit has a low logic level and the third pass bit has a high logic level, the total delay time of the tunable delay circuit is relatively long.

11. A method for operating a tunable delay circuit, comprising the steps of:
- selecting an input signal or a feedback signal as a first output signal according to an enable signal by a first multiplexer;
- delaying the first output signal for different time periods so as to generate a plurality of delay signals by a delay chain, wherein one of the delay signals is used as the feedback signal; and
- selecting one of the delay signals as a second output signal according to a pass signal by a second multiplexer;
- wherein the first multiplexer comprises a first NAND gate having a first input terminal for receiving the input signal, and a second input terminal for receiving an inverted enable signal;
- wherein the first multiplexer further comprises:
  - a second NAND gate, wherein the second NAND gate has a first input terminal for receiving the feedback signal, a second input terminal for receiving the enable signal, and an output terminal; and
  - an AND gate, wherein the AND gate has a first input terminal coupled to an output terminal of the first NAND gate, a second input terminal coupled to the output terminal of the second NAND gate, and an output terminal for outputting the first output signal.

12. The method as claimed in claim 11, wherein when the first multiplexer selects the input signal, the tunable delay circuit is operated in a delay mode, and wherein when the first multiplexer selects the feedback signal, the tunable delay circuit is operated in an oscillating mode.

13. The method as claimed in claim 12, wherein in the oscillating mode, a ring oscillator is formed by the first multiplexer and the delay chain.

14. The method as claimed in claim 13, wherein a total delay time of the tunable delay circuit is measurable by analyzing an oscillating frequency of the ring oscillator.

15. The method as claimed in claim 12, wherein in the delay mode, a total delay time of the tunable delay circuit is adjustable by changing the pass signal.

16. The method as claimed in claim 11, wherein the pass signal comprises a plurality of pass bits, and wherein the delay chain and the second multiplexer comprise:
- a third NAND gate, wherein the third NAND gate has a first input terminal for receiving the first output signal, a second input terminal for receiving a first pass bit, and an output terminal;
- a fourth NAND gate, wherein the fourth NAND gate has a first input terminal for receiving an inverted first pass bit, a second input terminal for receiving the first output signal, and an output terminal;
- a fifth NAND gate, wherein the fifth NAND gate has a first input terminal coupled to the output terminal of the third NAND gate, a second input terminal, and an output terminal for outputting the feedback signal; and
- a sixth NAND gate, wherein the sixth NAND gate has a first input terminal coupled to the second input terminal of the fifth NAND gate, a second input terminal coupled to the output terminal of the third NAND gate, and an output terminal for outputting the second output signal.

17. The method as claimed in claim 16, wherein the delay chain and the second multiplexer further comprise:
- a seventh NAND gate, wherein the seventh NAND gate has a first input terminal coupled to the output terminal of the fourth NAND gate, a second input terminal for receiving a second pass bit, and an output terminal;
- an eighth NAND gate, wherein the eighth NAND gate has a first input terminal for receiving an inverted second pass bit, a second input terminal coupled to the output terminal of the fourth NAND gate, and an output terminal;

a ninth NAND gate, wherein the ninth NAND gate has a first input terminal coupled to the output terminal of the seventh NAND gate, a second input terminal, and an output terminal coupled to the first input terminal of the sixth NAND gate; and a tenth NAND gate, wherein the tenth NAND gate has a first input terminal coupled to the second input terminal of the ninth NAND gate, a second input terminal coupled to the output terminal of the seventh NAND gate, and an output terminal.

18. The method as claimed in claim 17, wherein the delay chain and the second multiplexer further comprise:

an eleventh NAND gate, wherein the eleventh NAND gate has a first input terminal coupled to the output terminal of the eighth NAND gate, a second input terminal for receiving a third pass bit, and an output terminal;

a twelfth NAND gate, wherein the twelfth NAND gate has a first input terminal for receiving an inverted third pass bit, a second input terminal coupled to the output terminal of the eighth NAND gate, and an output terminal;

a thirteenth NAND gate, wherein the thirteenth NAND gate has a first input terminal coupled to the output terminal of the eleventh NAND gate, a second input terminal, and an output terminal coupled to the first input terminal of the tenth NAND gate; and a fourteenth NAND gate, wherein the fourteenth NAND gate has a first input terminal coupled to the second input terminal of the thirteenth NAND gate and to the output terminal of the twelfth NAND gate, a second input terminal coupled to the output terminal of the eleventh NAND gate, and an output terminal.

19. The method as claimed in claim 18, wherein the output terminal of the tenth NAND gate and the output terminal of the fourteenth NAND gate are kept floating.

20. The method as claimed in claim 18, wherein when the first pass bit has a high logic level and the second pass bit has a high logic level and the third pass bit has a high logic level, a total delay time of the tunable delay circuit is relatively short, wherein when the first pass bit has a low logic level and the second pass bit has a high logic level and the third pass bit has a high logic level, the total delay time of the tunable delay circuit is relatively medium, and wherein when the first pass bit has a low logic level and the second pass bit has a low logic level and the third pass bit has a high logic level, the total delay time of the tunable delay circuit is relatively long.

* * * * *